(12) United States Patent
Sugizaki

(10) Patent No.: US 6,253,341 B1
(45) Date of Patent: *Jun. 26, 2001

(54) IC TEST SYSTEM

(75) Inventor: Takayuki Sugizaki, Tokyo (JP)

(73) Assignee: Ando Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/086,013

(22) Filed: May 28, 1998

(30) Foreign Application Priority Data

May 30, 1997 (JP) .................................. 9-142764

(51) Int. Cl.$^7$ .................................. G11C 29/00
(52) U.S. Cl. ........................ 714/721; 324/158.1
(58) Field of Search .................. 714/724, 723, 714/225, 719, 736, 721, 718, 745, 725; 324/102, 158.1; 368/118; 365/189.1, 191, 230.01, 193, 201, 219

(56) References Cited

U.S. PATENT DOCUMENTS

| | | | | |
|---|---|---|---|---|
| 3,585,500 | * | 6/1971 | Grubel | 324/102 |
| 5,477,139 | * | 12/1995 | West et al. | 324/158.1 |
| 5,581,177 | * | 12/1996 | Hussey et al. | 324/158.1 |
| 5,673,275 | * | 9/1997 | Garcia et al. | 714/724 |
| 5,845,234 | * | 12/1998 | Testa et al. | 702/119 |

OTHER PUBLICATIONS

Souders et al. (A wideband sampling voltmeter; IEEE, Jun. 6, 1996).*
Watanabe et al. (A 286 mm/sup 2/256 Mb DRAM with /spl times/32 both–ends DQ; IEEE, Apr. 1996).*
Jei–Hwan Yoo et al. (A 32–bank 1 Gb self–strobing synchronous DRAM with 1 GByte/s bandwidth; IEEE, Nov. 1996).*

* cited by examiner

*Primary Examiner*—Albert Decady
*Assistant Examiner*—Guy J. Lamarre
(74) *Attorney, Agent, or Firm*—Fish & Richardson P.C.

(57) ABSTRACT

An IC testing system is provided with comparator circuits for comparing at two types of voltage levels, with respect to an output signal of a device to be measured, a memory for storing the state of window strobe of each test cycle, based on test control signals for strobe decisions, control signal generating circuits for generating control signals related to the generation of window strobes, based on the state stored in the aforementioned memory, and a signal decision circuit generating strobe signals which have been timing-corrected, in response to the voltage levels for window strobe decisions for producing window strobes, based on the control signals from the aforementioned control signal generating circuit and the aforementioned test control signals, and window strobes for performing window strobe decisions with respect to signals from the aforementioned comparator circuits.

17 Claims, 9 Drawing Sheets

FIG.3

| ADDRESS | 3-1 | 3-2 | 5 |
|---|---|---|---|
| 0 | WINDOW START at b-1 | — | WINDOW START at b-1 |
| 1 | WINDOW START at b-2 | — | WINDOW START at b-2 |
| 2 | — | — | — |
| 3 | WINDOW END at b-1 | WINDOW END at b-2 | WINDOW END |

FIG.6

| ADDRESS | CONTROL SIGNAL j-1 or j-2 | 3'-1 | 3'-2 |
|---|---|---|---|
| 0 | — | WINDOW START at b-1 | — |
| 1 | — | WINDOW START at b-2 | — |
| 2 | "H" | — | — |
| 3 | "L" | WINDOW END at b-1 | WINDOW END at b-2 |

FIG.9

| ADDRESS | 3-1 | 3-2 |
|---|---|---|
| 0 | WINDOW START at b-1 | - |
| 1 | WINDOW START at b-2 | - |
| 2 | - | - |
| 3 | - | WINDOW END |

IC TEST SYSTEM

BACKGROUND OF THE INVENTION

1. Field of the Invention

The present invention relates to an IC test system for measuring IC devices, and more particularly to an IC test system for the case in which window strobe decisions extending over a plurality of test cycles are executed.

This application is based on patent application No. Hei 9142764 filed in Japan, the content of which is incorporated herein by reference.

2. Description of the Related Art

Window strobe decision is made for deciding the state of an output signal from an IC device for measuring whether or not a manufactured IC device is outputting the operational signals as it was designed, in a time period which is prescribed by two strobe signals. FIG. 7 is a diagram showing an example of the construction for the IC test system which decides window strobe decisions for an IC device which is to be measured.

In FIG. 7, the reference symbols 1, 2-1 and 2-2, 3-1 and 3-2, and 4-1 and 4-2 represent a device to be measured, comparator circuits, strobe generating circuits, and decision circuits, respectively.

In this IC test circuit, an output signal(a) from the device to be measured 1 is respectively level compared at voltage levels b-1 and b-2, which are to become as references in the comparator circuits 2-1 and 2-2 and are input to the decision circuits 4-1 and 4-2, respectively.

On the other hand, in order to perform a window strobe decision, a test cycle signal(d) and address(e) are input to the strobe generating circuits 3-1 and 3-2, and based on this signal, the strobe generating circuits 3-1 and 3-2 which output a start strobe that becomes a start signal and an end strobe that becomes an end signal f-1, f-2 respectively and output control signals g-1, g-2 to the decision circuits 4-1 and 4-2, for controlling the decision circuits 4-1, 4-2.

On the other hand, window strobe decisions are performed in the decision circuits 4-1, 4-2, with respect to output signals c-1, c-2 from the comparator circuits 2-1, 2-2, using the strobe signals f-1, f-2 and the control signals g-1, g-2 from the strobe generating circuits 3-1, 3-2, and outputs decision signals h-1, h-2.

Next, an operational example of the IC test system of FIG. 7 will be described with reference to the accompanying FIGS. 8 and 9. Furthermore, FIG. 8 is a diagram showing an example of the operating waveforms for the IC test system indicated in FIG. 7, and FIG. 9 is a figure showing an operation table which summarizes the operations, with respect to the address(e) of the strobe generating circuits 3-1 and 3-2.

In FIG. 8,(1) represents the of the output (a) from the device to be measured 1 and the waveforms of the voltage level b-1 and the voltage level b-2 which are input to the comparator circuits 2-1, 2-2 of FIG. 7.

In addition, (2) and (3) respectively represents output signals c-1, c-2 from the comparator circuits 2-1, 2-2, and (4) and (5) represent the test cycle signal(d) and the address (e) which are input to the strobe generating circuits 3-1, 3-2 respectively. (6)–(9) respectively represent the strobe signals f-1, f-2 and the waveform diagrams of the control signals g-1, g-2 output from the strobe generating circuits 3-1, 3-2. In addition, (10),(11) respectively represents the waveform diagram of the window strobe waveform which is generated inside the decision circuits 4-1, 4-2.

Here, when the address(e) is at "0" as indicated in (5) of FIG. 8, the strobe generating circuit 3-1 operates as a window start strobe and generates a start strobe which has been timing-corrected at the voltage level b-1. Moreover, here "the timing-corrected strobe signal" means that the strobe signal is generated with a timing which has been described beforehand, in response to the various voltages. Specifically, in the example of FIG. 8, timings which are corrected at each voltage level b-1, b-2 are stored in the strobe generating circuit 3-1, and timing corrections are made for generating strobe signals, based on this content of the memory.

Further, when the address(e) is "1", the strobe generating circuit 3-1 operates as a window start strobe and performs the generation of a start strobe for which timing correction has been made at the voltage level b-2 of FIG. 8. When the address(e) is "2" or "3", this strobe generating circuit 3-1 does not operate.

On the other hand, when the address(e) is "0", "1" or "2", the strobe generating circuit 3-2 does not operate but instead operates as a window end strobe, when the address(e) is "3", FIG. 9 is a summary of the operations for each of the strobe generating circuits 3-1, 3-2 with respect to this address(e). When a circuit does not operate, it is marked as "-" in FIG. 9.

Further, with respect to output signal(a) from the device 1 to be measured which is indicated in (1) of FIG. 7, the comparator circuits 2-1, 2-2 output the results of the comparison at voltage levels b-1, b-2 as signals(2),(3).

Next, the test cycle signal(d) goes from the first cycle through the eighth cycle as in (4),(5) of FIG. 8, and the operation of the IC test system for the case in which the address(e) changes to 0, 2, 2, 3, 1, 2, 2 and 3, in response to the test cycle, is described as follows.

First, in the comparator 2-1 for the first test cycle, in order to decide the signal(2) which has been output/compared at the voltage level b-1, the address(e) goes to "0", and the strobe generating circuit 3-1 outputs start strobe α1 which has timing-corrected at the level b-1 and a control signal "A", which signifies the window strobe start in the decision circuit 4-1.

In the second and third test cycles, since the window strobe decision becomes one which extends over a plurality of test cycles, the address(e) goes to "2".

In the fourth cycle, in order to end the window strobe, the address(e) goes to "3", and the strobe generating circuit 3-2 outputs an end strobe α2 and a control signal "B" , which signifies window strobe end in the respective decision circuits 4-1 and 4-2.

Furthermore, in the comparator circuit 2-2 for the fifth cycle, the address(e) goes to "1" for deciding a signal(3) which has been compared/output at the voltage level b-2, and the strobe generating circuit 3-1 outputs a start strobe α3 which has been timing-corrected at the level b-2 and a control signal(C) which signifies window strobe start at the decision circuit 4-2.

In the sixth and seventh cycles, since the decision becomes a window strobe decision which extends over a plurality of testing cycles, the address(e) goes to "2".

In the eighth cycle, in order to end window strobe, the address(e) goes to "3", and the strobe generating circuit 3-2 outputs an end strobe α4 and a control signal(B), which signifies window strobe finish at respective decision circuits.

In addition, such strobe windows as those indicated in (10) and (11) are generated within the decision circuits 4-1 and 4-2, based on the strobe signals f-1, f-2 and the control signals g-1, g-2 from the strobe circuits 3-1, 3-2, and a window strobe decisions are made.

Here, the normal window strobe decision using IC test system is completed without extending over to a plurality of test cycles. However, depending on the case, there may be cases in which the decision will be completed after several cycles from the test cycle which the window strobe started. In a normal IC test system, since consideration has not been given to window strobe decision which extends over to a plurality of test cycles in this way, even if "3" which signifies window strobe end similar to the address(e) as shown in (5) of FIG. 8 has been sent, it is incapable of concluding as to which of the voltage levels the window strobe decision end corresponds.

For this reason, since with respect to which voltage level the strobe decision starts can be known in FIG. 8, at the window strobe start of the first cycle and at the window strobe start of the fifth cycle, the start strobe which has been optimally timing-corrected at the voltage level b-1 or b-2 can be output. However, since it is unclear as to what voltage level the end of the window strobe decision corresponds, at the end of window strobe for the fourth test cycle and at the end of window strobe of the eighth cycle, outputting of end strobe which has timing-corrected in response to the voltage level cannot be output.

That is, in an ordinary IC test system, since it is incapable of deciding as to at which voltage level of window strobe decision will end for the case in which window strobe decision extends over a plurality of test cycles, in a strobe generating circuit, an end strobe which has been optimally timing-corrected in response to the voltage level cannot be generated. As a result, there is the problem that appropriate measurement results cannot be obtained.

SUMMARY OF THE INVENTION

It is an object of the present invention to provide an IC test system which is capable of obtaining appropriate measurement results, while taking such a situation into consideration, even if this decision is a window strobe decision which may extend over a plurality of test cycles in an IC test cycle.

For this reason, according to the present invention, a memory for storing the state of window strobe for each test cycle, and control signal generating circuit for generating a control signal related to the generation of window strobe is provided, based on the state which is stored in this memory, storing the state of window strobe for each test cycle, and an IC test system for conducting window strobe decisions by window strobes, which have been timing-corrected in response to the voltage level by the signal decision circuit is provided.

From this, since in what state the window strobe decision has been started is monitored at every testing cycle, optimally timing-corrected strobe can be controlled for each voltage level, even when a window strobe which extends over a plurality of test cycles is generated, thereby realizing high precision for the measurement.

BRIEF DESCRIPTION OF THE DRAWINGS

The present invention will be described in further detail with reference to the accompanying drawings, in which:

FIG. 3 is a table representing the operation and storage content of the memory for the strobe generating circuit of the IC test system of FIG. 1;

FIG. 6 is an operation table of the strobe generating circuit of the IC test system of FIG. 4;

FIG. 9 is an operating table of the strobe generating circuit for the IC test system of FIG. 7.

DESCRIPTION OF PREFERRED EMBODIMENTS

An IC test system according to embodiments of the present invention will be described with reference to the drawings.

First Embodiment

Figure 1:
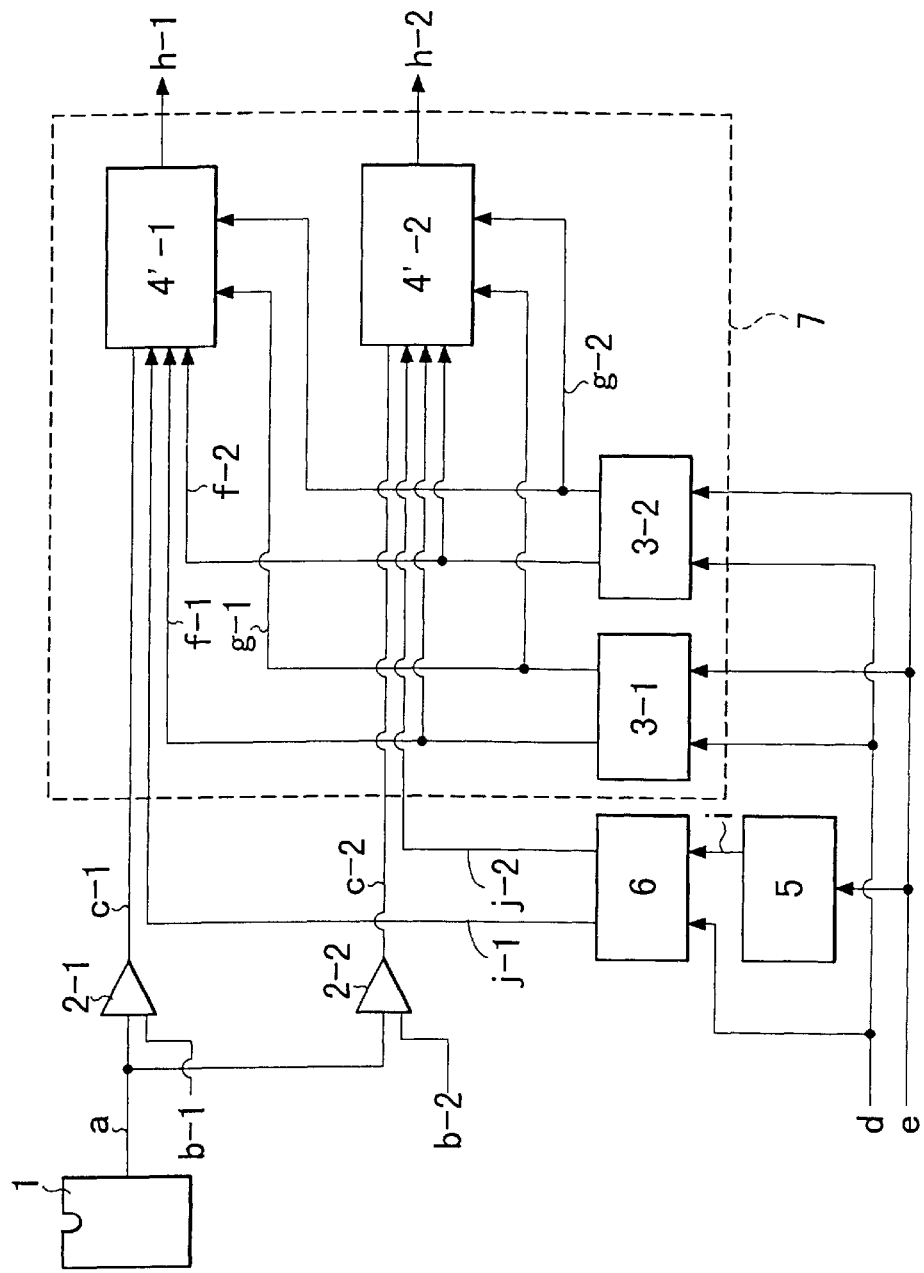
FIG. 1 is a construction diagram of the IC test system according to an embodiment of the present invention.
Figure 7:
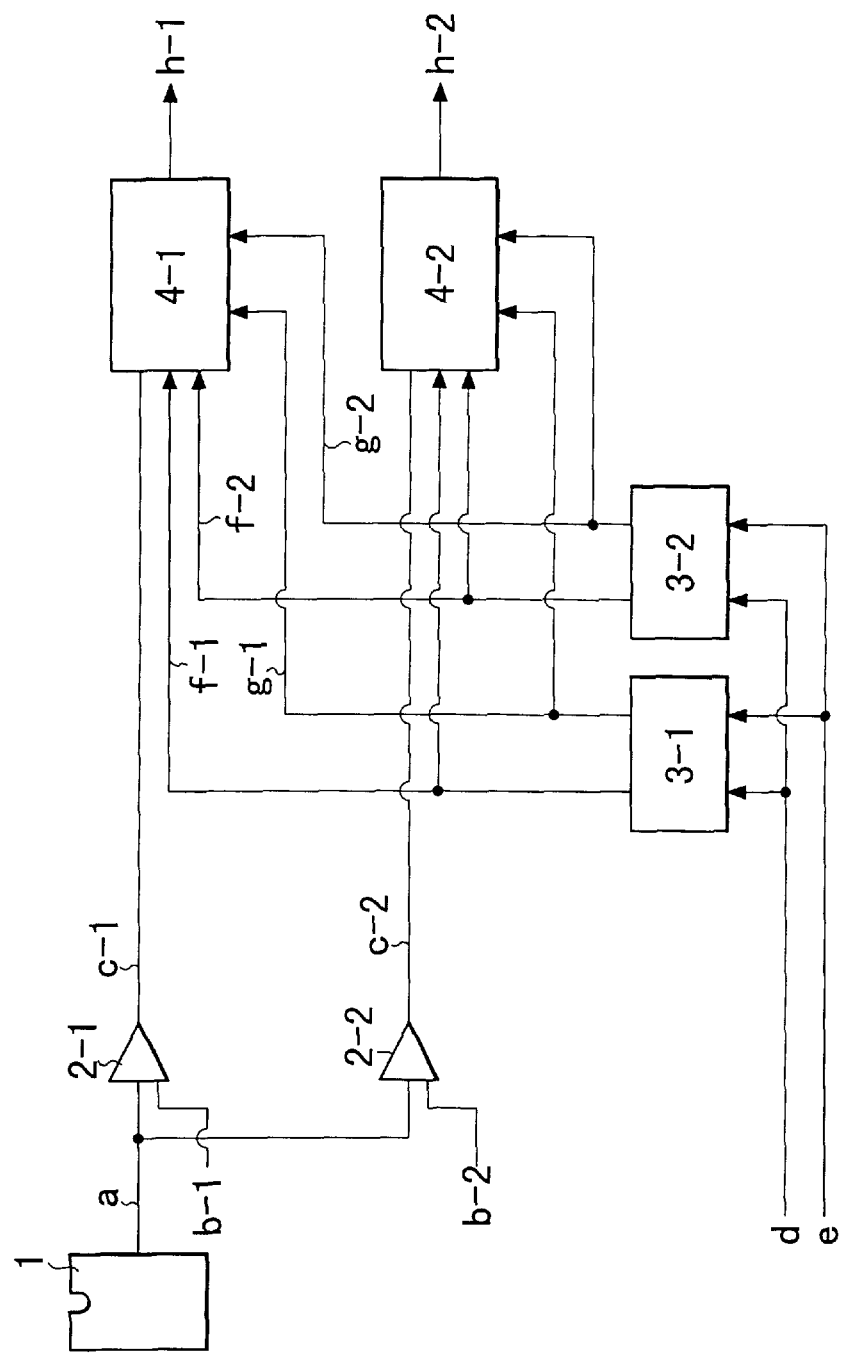
FIG. 7 is a diagram showing an example of the construction of the IC test system.

FIG. 1 is a construction diagram of the IC test system according to an embodiment of the present invention. In FIG. 1, the reference symbol 1 represents a device to be measured, and following reference symbols are represented respectively: 2-1 and 2-2 represent the comparator circuits, the reference symbols 3-1 and 3-2 represent the strobe generating circuits, the reference symbols 4'-1 and 4'-2 represent the decision circuits, the reference symbol 5 represents a memory, and the reference symbol 6 represents a control signal generating circuit. Here, the device to be measured 1 of FIG. 1, the comparator circuits 2-1 and 2-2, the strobe generating circuits 3-1 and 3-2 are identical in circuit construction with the IC test system shown in FIG. 7, and the decision circuits 4'-1 and 4'-2 of FIG. 1 correspond to the decision circuits 4-1 and 4-2 of FIG. 7, respectively. Furthermore, the strobe generating circuits 3-1 and 3-2, and the decision circuits 4'-1 and 4'-2 together as a lump are to be referred hereinafter as "signal decision circuits".

Moreover, the state of the window strobe at each test cycle is stored in the memory 5. For the state which is stored, for example, when attempt is made to perform window strobe decision with the voltage levels at b-1 and b-2, one of the four states: "window strobe decision start at level b-1", "window strobe decision start at level b-2", "window strobe decision end", and "non-operating" is to be stored.

On the other hand, at each test cycle, an output "i" is received in the control signal generating circuit 6 indicating the state in that test cycle which is stored in the memory 5. If a window strobe is started in that test cycle, the circuit 6 holds whether the decision is at the voltage level b-1 or at the voltage level b-2, until the test cycle of the window strobe decision end. Then, during the time of the test cycle in which the output "i" shows the window strobe decision end, the circuit generates the control signal j-1 or j-2 for operation stop to either of the decision circuits which has not been selected, 4'-1 or 4'-2, according to the values held. For example, if it is found that the window strobe decision at the voltage level b-1 will end, from the value held, the operation stop signal j-2 is sent to the voltage b-2 with respect to the decision circuit 4'-2.

Furthermore, at the time of window strobe decision end, the two strobe generating circuits 3-1 and 3-2 generate the strobe signals f-1 and f-2 which have timing-corrected, corresponding to each voltage levels b-1 and b-2. That is, in the same test cycle, the strobe generating circuit 3-1 generates the end strobe f-1 which has been timing-corrected, in response to the voltage level b-1, and the strobe generating circuit 3-2 generates the end strobe f-2 which has been timing-corrected, in response to the voltage level b-2 at the time of window strobe decision end.

Then, in the decision circuits 4'-1 and 4'-2, the strobe signals f-1, f-2 and the control signals g-1, g-2 are received from the strobe generating circuits 3-1, 3-2, window strobes are generated which have timing-corrected in response to each voltage level, and decisions for the output signals c-1, c-2 from the comparator circuits 2-1 and 2-2 are performed. Further, by the control signals j-1, j-2 from the control signal generating circuit 6, only the decision circuits 4'-1, 4'-2 are to be operated, corresponding to the decision at each voltage level.

Figure 2:
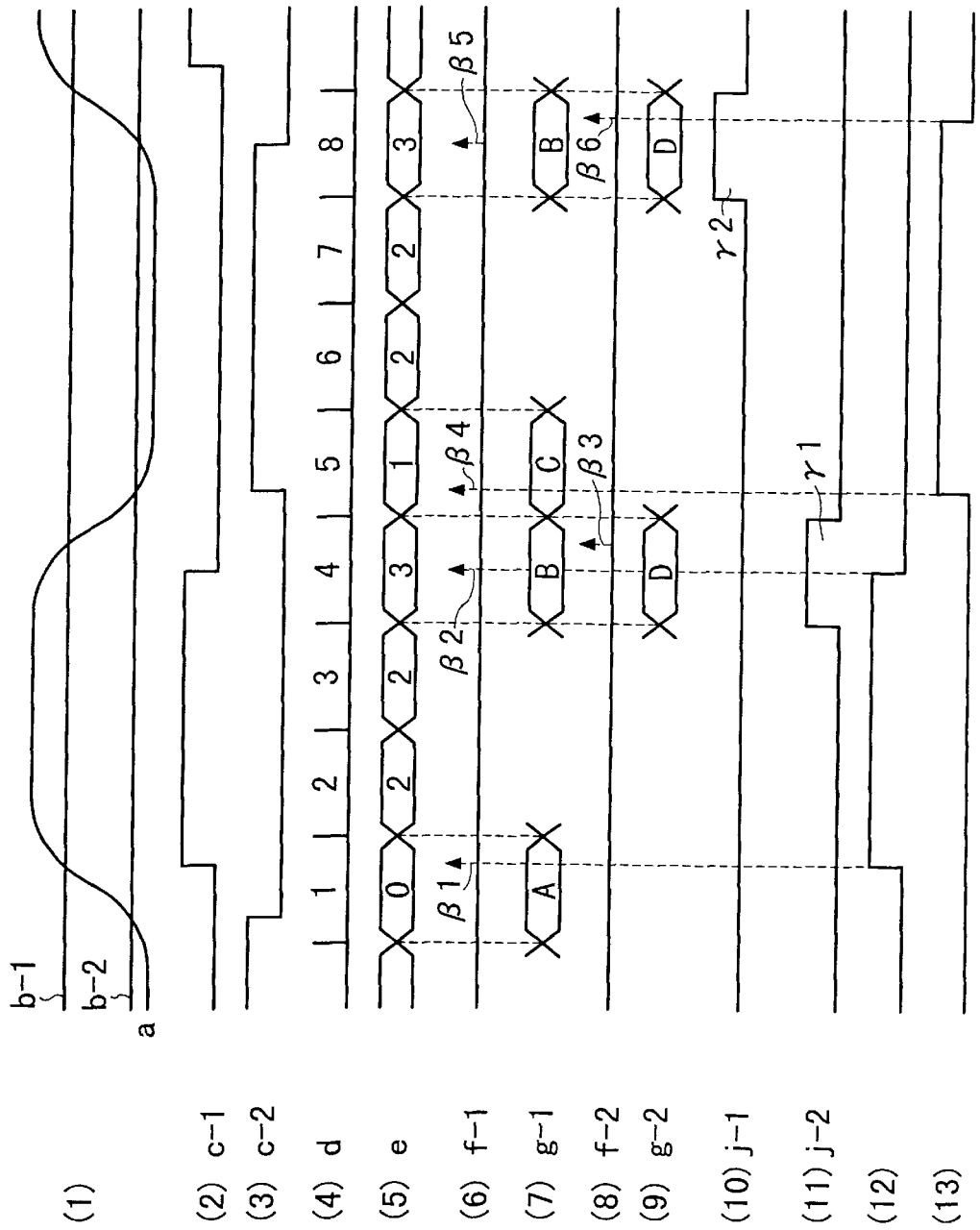
FIG. 2 is a diagram showing an example of the operating waveforms of the IC test system of FIG. 1.

Next, the detailed operations of the IC test system according to the present invention will be described with accompanying FIGS. 2 and 3. FIG. 2 is a diagram showing an example of the operating waveforms of the IC test system of FIG. 1, and FIG. 3 is a diagram showing the operation table which summarizes the operations of the strobe generating circuits 3-1, 3-2 and the memory 5, corresponding to the address(e).

In FIG. 2, (1) shows the output(a)from a device to be measured 1, and a diagram of waveforms for the voltage levels b-1, b-2 which serve as references. (2) and (3) indicate output signals c-1, c-2 from the output from the comparator circuits 2-1, 2-2 respectively in FIG. 1, and (4) and (5) indicate the strobe generating circuits 3-1, 3-2 and the test cycle signal(d) and the address(e) which are input signals to the control signal generating circuit 6, respectively. In addition, this test cycle signal(d) and the address(e) turn into test control signals for strobe decision at the IC test system. (6) to (9) respectively indicates the waveform diagram for the strobe signals f-1, f-2 and the control signals g-1, g-2 which are output from the strobe generating circuits 3-1, 3-2. (10) and (11) respectively indicates the waveform diagram for the control signals j-1, j-2 which are output from the control signal generating circuit 6.

Further, (12) and (13) respectively indicates the waveform diagram for the window strobe waveforms of the inside of the decision circuits 4-1, 4-2.

From the operation table of the strobe generating circuits 3-1, 3-2 and the memory 5 which correspond to the address (e) of FIG. 3, when the strobe generating circuit 3-1 is "0", it operates as a window start strobe at the voltage level b-1 and generates a start strobe which has timing-corrected at the voltage level b-1. When it is at address "1", it operates as a window start strobe at the voltage level b-2 and generates a start strobe which has been timing-corrected at the voltage level b-2. Then, when it is at address "2", it does not operate; and when it is at address "3", it operates as a window end strobe at the voltage level b-1 and generates an end strobe which has been timing-corrected at the voltage level b-1.

On the other hand, the strobe generating circuit 3-2 does not operate when it is at the addresses "0", "1" or "2"; and when it is at the address "3", it operates as a window end strobe at the voltage level b-2 and generates an end strobe which has been timing-corrected at the voltage level b-2.

Moreover, at the address "0", the state "window strobe start at the voltage level b-1"; at address "1", the state "window strobe start at the voltage level b-2"; at address "2", the state "non-operating"; and at address "3", the state "window strobe end" are respectively stored in the memory 5.

Next, a diagram of waveforms which is shown in FIG. 2 will be described in detail.

The output signal(a) from the device to be measured 1, which is indicated in (1) of FIG. 2, is compared at the respective voltage levels b-1, b-2 in the comparator circuits 2-1, 2-2 and the output signals c-1, c-2 are output, as indicated in (2),(3).

Figure 8:
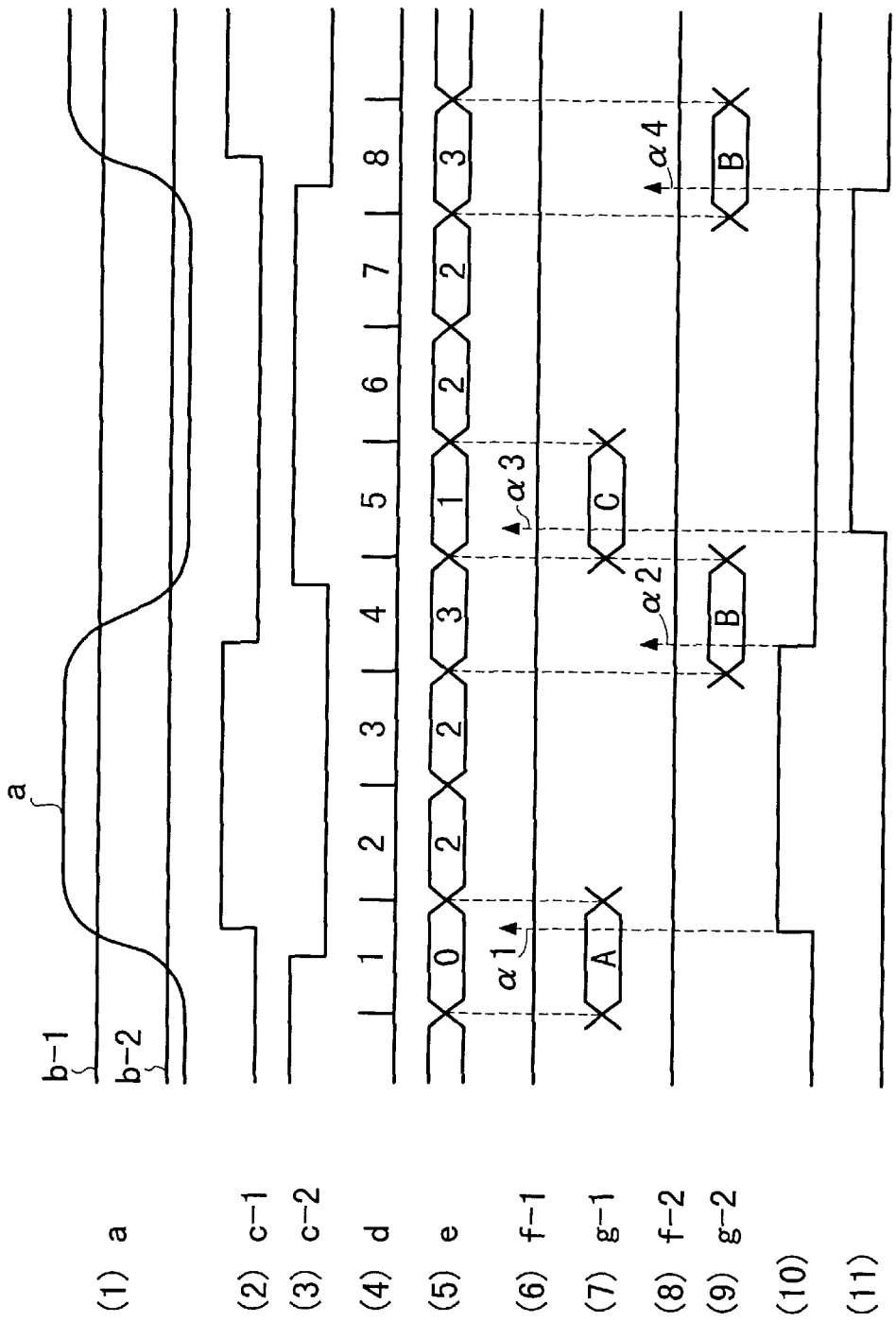
FIG. 8 is a diagram showing the operating waveforms of the IC test system of FIG. 7.

On the other hand, as indicated in (4),(5) of FIG. 2, when the test cycle signal(d)goes from the first test cycle to the eighth cycle, the address(e) is considered to have changed to 0, 2, 2, 3, 1, 2, 2 and 3. Here, although the significance of the address(e) is as have been described in FIG. 8, its description at each of the test cycles results as follows.

First, in order to decide the signal(2)in the first test cycle, the address(e) goes to "0" which signifies a window strobe start, related to the voltage level b-1. Then in the second and third test cycles, the address(e) goes to "2", since the window strobe decision is one which extends over to a plurality of test cycles. Then, in the fourth cycle, the address(e) goes to "3", in order to end the window strobe decision.

Furthermore, in order to decide the signal(3) in the fifth test cycle, the address(e) goes to "1" which signifies a window strobe start, related to the voltage level b-2, and the address(e) goes to "2", so as to continue the decision at the sixth and seventh test cycles. Then, the address(e) goes to "3", so as to end the window strobe in the eighth test cycle.

By the input of the test cycle signal(d) and the address(e) indicated in (4),(5) of this FIG. 2, the strobe generating circuits 3-1,3-2 output such signals as those which are indicated in the waveforms (6) to (9). In other words, in the first test cycle, the strobe generating circuit 3-1 generates a start strobe β1 which has been timing-corrected at the voltage level b-1, along with outputting of a control signal (A), so as to have a window strobe generated with respect to the decision circuit 4'-1 which is related to the voltage level b-1. In the second and third steps, owing to the address(e) being at "2", the strobe generating circuits 3-1, 3-2 do not perform outputting of signals. Then, in the fourth test cycle, owing to the address(e) being at "3" which signifies a window strobe end, the strobe generating circuit 3-1 generates an end strobe β2 which has been timing-corrected at the voltage level b-1, along with outputting of a control signal (B), so as to end the generation of window strobe at the decision circuit 4'-1. On the other hand, the strobe generating circuit 3-2 generates an end strobe β3 which has been timing-corrected at the voltage level b-2 in this fourth test cycle, along with outputting of a control signal(D), so as to end the generation of window strobe at the decision circuit 4'-2.

Then, since the address(e) is at "1" in the fifth test cycle, the strobe generating circuit 3-1 generates a start strobe β4 which has been timing-corrected at the voltage level b-2, along with outputting of a control signal(C), so as to start the generation of window strobe with respect to the decision circuit 4'-2 which is related to the voltage level b-2. In the sixth and seventh steps, owing to the address(e) being at "2", the strobe generating circuits 3-1, 3-2 do not perform outputting of signals. Then, in the eighth test cycle, owing to the address(e) being at "3" which means a window strobe end, they perform an operation similar to the fourth test cycle. Namely, the strobe generating circuit 3-1 generates a window end strobe β5 which has been timing-corrected at the voltage level b-1, along with outputting of the control signal(B) to end the generation of window strobe at the decision circuit 4'-1. On the other hand, the strobe generating circuit 3-2 generates an end strobe β6 which has been timing-corrected at the voltage level b-2 in this eighth test cycle, along with outputting of a control signal(D) for ending the generation of window strobe at the decision circuit 4'-2.

On the other hand, in the first test cycle, since the state which is stored in the memory 5 is the state "window strobe start at the level b-1", the control signal generating circuit 6 holds this state and continues to hold the state of the first test cycle, since the storage content of the memory 5 is in the state "non-operating" in the second and third test cycles. Then, since the storage content of the memory 5 in the fourth test cycle is the state "window strobe end", the circuit outputs a control signal γ1 which sets the signal to "H" (High), in order to stop the operation with respect to the decision circuit 4'-2 which has not started window strobe decision from the state held heretofore.

Furthermore, in the fifth test cycle, since the state which is stored in the memory 5 is the state "window strobe start at level b-2", the control signal generating circuit 6 holds this state, and continues to hold the state of the fifth test cycle, since the stored content is in the state "non-operating" in the sixth and seventh test cycles. Then, in the eighth test cycle, since the storage content of the memory 5 is in the state "window strobe end", the circuit outputs a control signal γ2 which set the signal to "H", in order to stop the operation with respect to the decision circuit 4'-1 which has not started window strobe decision from the state held heretofore.

Then, in the decision circuits 4'-1, 4'-2, the strobe signals f-1, f-2 from the strobe generating circuits 3-1, 3-2, the control signals g-1, g-2, and the control signals j-1 or j-2 from the signal generating circuit 6 are set as the input signals, and window strobes are generated waveforms of which are indicated as in (12),(13) inside the circuit.

Therefore, in the first test cycle, the decision circuit 4'-1 receives the start strobe β1 of the strobe generating circuit 3-1 and the control signal(A) and starts a window strobe, based on this signal. Then in the fourth cycle, the circuit receives the end strobe β2 of the strobe generating circuit 3-1 and the control signal(B), and ends the generation of the window strobe, based on this signal. In addition, in the eighth test cycle, although the start strobe β5 and the control signal(B) are received as input signals from the strobe generating circuit 3-1, since the control signal for operation stop γ2 is input from the control signal generating circuit 6 at the same time, it does not perform its operation. As a result of this, such generation as the one which is indicated in the waveform (12) is performed, and a decision is performed, using a window strobe which has been timing-corrected in response to this voltage level b-1.

On the other hand, in the fifth test cycle, the decision circuit 4'-2 receives the start strobe β4 and the control signal (C) of the strobe generating circuit 3-1 and starts the generation of a window strobe, based on this signal. Then, in the eighth test cycle, the circuit receives the end strobe β6 and the control signal(D) of the strobe generating circuit 3-2 and ends the generation of window strobe, based on this signal. In addition, in the fourth test cycle, although the circuit receives the end strobe β3 and the control signal(D) as input signals from the strobe generating circuit 3-2, it does not perform its operation, since the control signal for operation stop γ1 from the control signal generating circuit 6 is input at the same time. As a result, the generation of window strobe such as the one indicated in the waveform (13) is performed, and a decision is performed using a window strobe which has been timing-corrected in response to this voltage level b-2.

In this way, by having the decision circuits 4'-1, 4'-2 use strobe signals in response to the control signal from the control signal generating circuit 6 and strobe signals in response to each voltage level from the strobe generating circuits 3-1, 3-2, window strobe which has been timing-corrected in response to each voltage level as indicated in (12) or (13) of FIG. 2 can be generated. As a result, even though the window strobe decision is one which extends over a plurality of test cycles, obtaining of the appropriate measurement results is enabled.

Second Embodiment

In the present embodiment and the embodiment which was previously described, although the signal input to a signal decision circuit 7 is the same, the points of difference lie in that rather than the signals j-1, j-2 from the control signal generating circuit 6 being input in the decision circuits 4'-1, 4'-2 which constitute the signal decision circuit 7, they are input to the strobe generating circuits 3'-1, 3'-2 and strobe signals f-1, f-2 and the control signals g-1, g-2 based on the control signal j-1 or j-2, are output in these strobe generating circuits 3'-1, 3'-2.

Other embodiments of the present invention will be described with reference to the drawings, centered on the points of difference for the IC test system in the embodiment previously mentioned.

Figure 4:
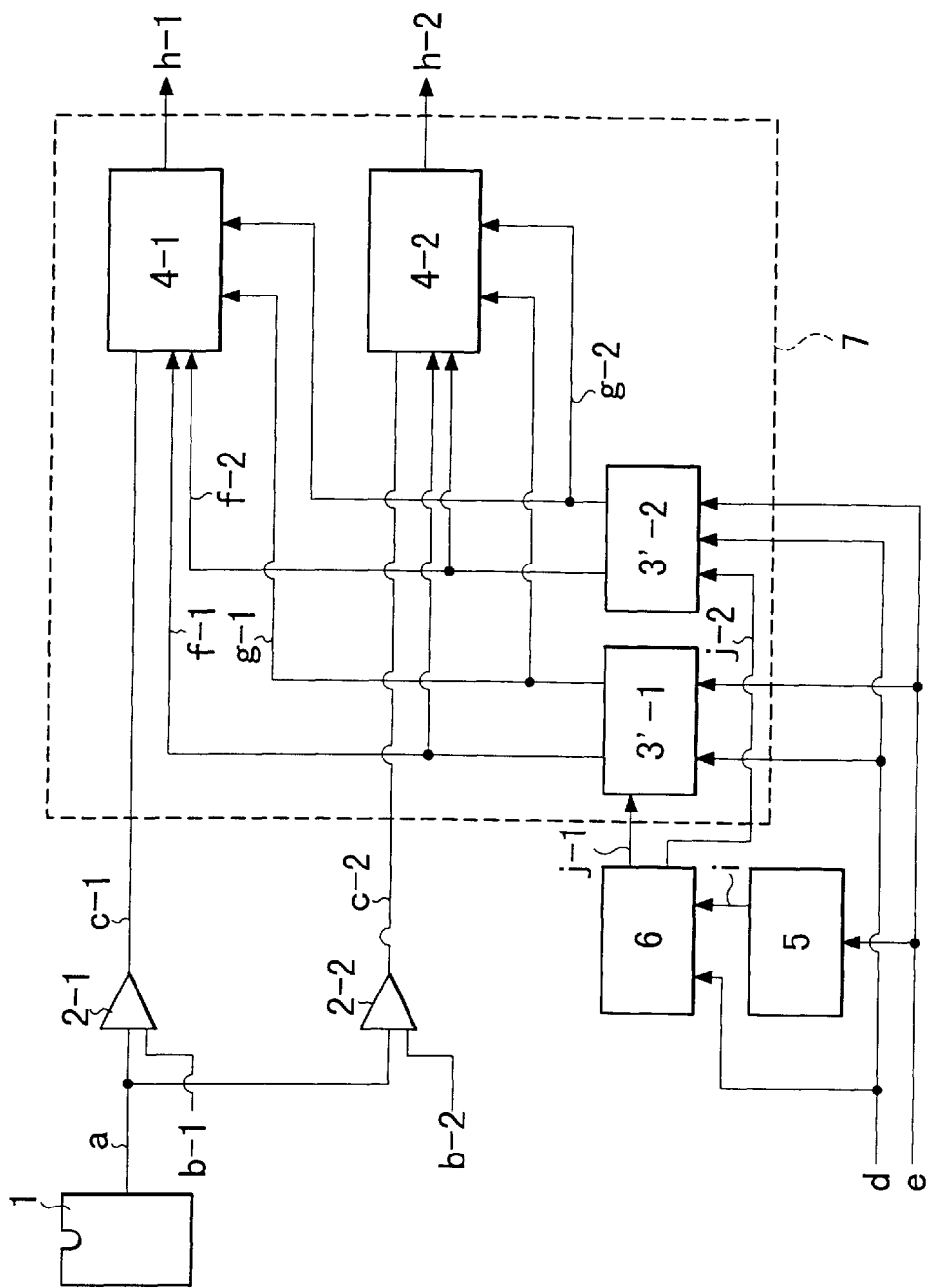
FIG. 4 is a construction diagram of the IC test system according to another embodiment of the present embodiment.

FIG. 4 is a construction diagram of the IC test system according to another embodiment of the present invention. In FIG. 4, identical reference symbols as those parts corresponding to respective parts of FIG. 1 are attached, and their descriptions are omitted. The differences in the construction between the FIG. 4 and FIG. 1 lie in that either of the output signal j-1 or j-2 of the control signal generating circuit 6 is input to the strobe generating circuits 3'-1, 3'-2 and that the decision circuits 4-1, 4-2 have become identical in circuit construction to those of the decision circuits 4-1, 4-2 of the FIG. 7.

FIG. 6 is a figure showing the operation table which summarizes the operations from having the control signal j-1 or j-2 input to the strobe generating circuits 3'-1, 3'-2. In FIG. 6, the operations of the strobe generating circuits 3'-1, 3'-2 when the address is at "0" to "2", is identical to the operations of the strobe generating circuits 3-1, 3-2 of the embodiment which has been described previously. However, when the address(e) is at "3", the operation differs, owing to whether the state of the control signal j-1 or j-2 being "H" (High) or L (Low). That is, only when the control signal j-1 is "L", does the strobe generating circuit 3'-1 output a control signal for ending the generation of window strobe at the decision circuit 4-1. On the other hand, only when control signal j-2 is "L" does the strobe generating circuit 3'-2 output an end strobe which has been timing-corrected by the voltage level b-2 and a control signal for ending the generation of window strobe at the decision circuit 4-2.

Figure 5:
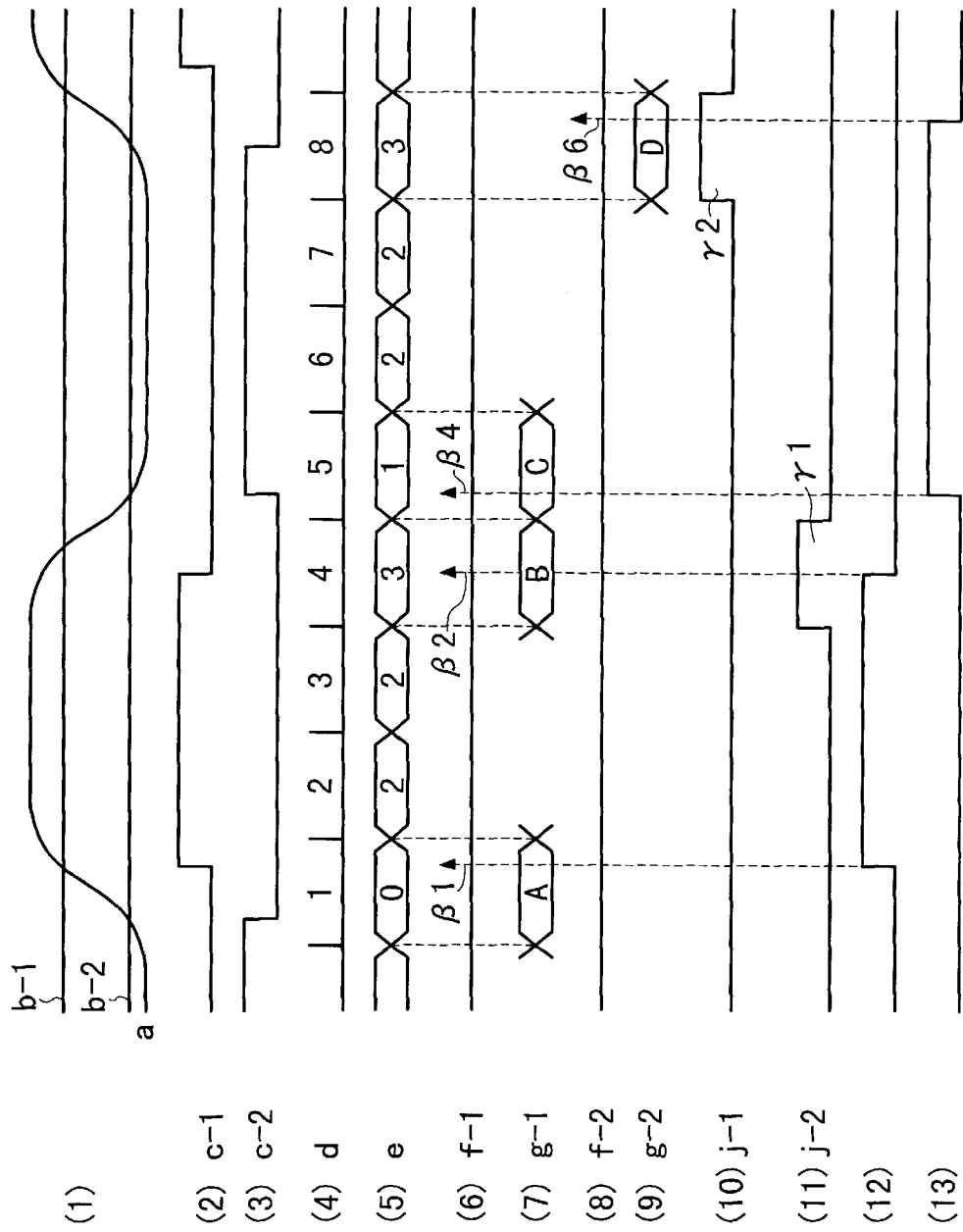
FIG. 5 is a diagram showing an example of the operating waveforms of the IC test system of FIG. 4.

Accordingly, in a test cycle signal(d) and the address(e) indicated in (4),(5) of FIG. 5, and the signals j-1, j-2 indicated by (10),(11), the strobe generating circuits 3'-1, 3'-2 output signals f-1, f-2, g-1 and g-2 as indicated in (6) to (9).

Then, the decision circuits 4-1, 4-2 generate the window strobes which have been timing-corrected in response to each of the voltages as indicated in (12),(13) with (6) to (9) as the input signals.

In this way, by having the strobe generating circuits 3'-1, 3'-2 generate the strobe signals and control signals, in the decision circuits 4'-1, 4'-2, using the signals by the control signal generating circuit 6, window strobes which have been timing-corrected in response to each of the voltage level, such as those indicated in (12) or (13) of FIG. 5 can be generated. As a result, appropriate measurement results can be obtained, even if the strobe decision extends over a plurality of test cycles.

As is described above, according to the IC test system of the present invention, following effects can be obtained.

In an IC test system, a memory for storing the state of window strobe for each cycle and a control signal generating circuit for generating the control signals, related to the generation of window strobes, are provided, based on the states which are stored in this memory and window strobe decisions are performed by window strobes which have been timing-corrected, in response to the voltage levels by the signal decision circuit. As a result of this, since in what state the window strobe decision has started is observed for each test cycle, strobe which has been optimally timing-corrected for each voltage level can be controlled, even when window strobe is generated which extends over a plurality of test cycles, and high precision in measurement can be realized.

Also when the state, which is stored in memory, is at in least the window strobe decision start state of each voltage level and in the window strobe decision end state, and when the state which has been stored in this memory goes to window strobe decision start state, the control signal generating circuit holds this state until the state which has been stored in the memory goes to the window strobe decision end state and transmits a control signal to the signal control circuit, based on this holding state. As a result of this, the output of the control signals by the control signal generating circuit, corresponding to the state of each test cycle is enabled, thereby realizing highly accurate measurements as the results.

Furthermore, the signal decision circuit consists of two strobe generating circuits, decision circuits for performing window strobe decision by the signals from these strobe generating circuits, and this decision circuit generates window strobe decisions by performing selecting of signals from the strobe generating circuits, based on the control signals from the control signal generating circuit. From this, in the decision circuit, the generation of window strobes which have been timing-corrected, in response to each voltage level using control signals by the control signal generating circuit, is enabled. As a result, obtaining appropriate measurement results is enabled, even if the window strobe decision extends over a plurality of test cycles.

Further, the signal decision circuit consists of two strobe generating circuits and decision circuits for performing window strobe decision by signals from these strobe generating circuits, and these strobe generating circuits generate strobe signals which have been timing-corrected, in response to the voltage levels for performing window strobe decisions, based on the control signal generating signals from the control signal generating circuit. As a result of this, the strobe generating circuits can generate strobe signals and the like which have been timing-corrected in response to each voltage level, using the signals by the control signal generating circuit 6. Consequently, obtaining the appropriate measurement results is enabled, even if the window strobe decision extends over a plurality of test cycles.

What is claimed is:

1. An IC test system comprising:

comparator circuits which compare a signal output from an integrated circuit to be tested with two kinds of voltage levels;

a memory which stores at least one of a window strobe decision start state and a window strobe decision end state for each of the two kinds of voltage levels in each test cycle, based on address signals and test cycle signals which are input for making a window strobe decision;

a control signal generating circuit which receives the state stored in the memory and outputs control signals relating to the generation of window strobes based on the states stored in the memory, and wherein, when the state stored in said memory corresponds to the window strobe decision start state, the control signal generating circuit holds the window strobe decision start state until the state stored in the memory changes to the window strobe decision end state; and a signal decision circuit which receives the address signals, the test cycle signals, and the control signals output by the control signal generating circuit, and based on these signals, generates timing-corrected strobe signals which are timing corrected with respect to the kinds of voltage levels, and performs window strobe decisions on the signals output by the comparator circuits.

2. The IC test system according to claim 1 wherein said signal decision circuit comprises:

strobe generating circuits which receive the address signals and the test cycle signals, and based on these signals, generate timing-corrected strobe signals which are timing corrected with respect to the kinds of voltage levels; and decision circuits which receive the control signals output by the control signal generating circuit and outputs from the strobe generating circuits, and based on these signals, perform window strobe decision on the signals output by the comparator circuit.

3. The IC test system according to claim 2 wherein said comparator circuits compare a signal output from an integrated circuit to be tested with a first voltage level and a second voltage level;

said strobe generating circuit includes a first strobe generating circuit and a second strobe generating circuit, the first strobe generating circuit which generates first strobe signals for window strobe start which have been timing corrected with respect to the first or second voltage levels and for window strobe end which have been timing corrected with respect to the first voltage level, based on the address signals and the test cycle signals, and the second strobe generating circuit which generates second strobe signals for window strobe end which have been timing corrected with respect to the second voltage level based on the address signals and the test cycle signals.

4. The IC test system according to claim 3 wherein said comparator circuits compare a signal output from an integrated circuit to be tested with a first voltage level and a second voltage level, said decision circuits include first and second decision circuits, said first decision circuit receives the signal output by the comparator to be tested with a first voltage level, the control signals from the control signal generating circuit, and signals from the first and second strobe generating circuits, and based on these signals, performs window strobe decisions on the signals output by the comparator circuits; and the second decision circuit receives the signal output by the comparator to be tested with second voltage level, the control signals from the control signal generating circuit, and signals from the first and second strobe generating circuits, and based on these signals, performs window strobe decisions on the signals output by the comparator circuits.

5. The IC test system according to claim 2 wherein
said comparator circuits compare a signal output from an integrated circuit to be tested with first voltage level and a second voltage level,
said decision circuits include first and second decision circuits,
said first decision circuit which receives the signal output by the comparator to be tested with first voltage level, the control signals from the control signal generating circuit, and signals from the first and second strobe generating circuits, and based on these signals, performs window strobe decisions on the signals output by the comparator circuits; and
the second decision circuit which receives the signal output by the comparator to be tested with second voltage level, the control signals from the control signal generating circuit, and signals from the first and second strobe generating circuits, and based on these signals, performs window strobe decisions on the signals output by the comparator circuits.

6. The IC test system according to claim 1 wherein said signal decision circuit comprises:
strobe generating circuits which receive the address signals, the test cycle signals and control signals output by the control signal generating circuit, and based on these signals, generate timing-corrected strobe signals which are timing corrected with respect to the kinds of voltage levels; and
decision circuits which receive outputs from the strobe generating circuits, and based on these signals, perform window strobe decision on the signals output by the comparator circuit.

7. The IC test system according to claim 6 wherein
said control signal generating circuits output control signals for stopping the operation of said strobe generating circuits to not output the timing-corrected strobe signals when the state stored in the memory changes to a window strobe decision end state; and
said strobe generating circuits does not perform the timing-corrected strobe signals, when the strobe generating circuits receive the control signals for stopping the operation output by the control signal generating circuit.

8. The IC test system according to claim 6 wherein
said comparator circuits compare a signal output from an integrated circuit to be tested with first voltage level and a second voltage level,
said strobe generating circuit includes a first strobe generating circuit and a second strobe generating circuit,
the first strobe generating circuit which generates first strobe signals for window strobe start which have been timing corrected with respect to the first or second voltage levels and for window strobe end which have been timing corrected with respect to the first voltage level, based on the address signals, the test cycle signals and the control signals output by the control signal generating circuit; and
the second strobe generating circuit which generates second strobe signals for window strobe end which have been timing corrected with respect to the second voltage level based on the address signals, the test cycle signals and control signals output by the control signal generating circuit.

9. The IC test system according to claim 8 wherein
said comparator circuits compare a signal output from an integrated circuit to be tested with a first voltage level and a second voltage level,
said decision circuits include first and second decision circuits,
said first decision circuit re. receives the signal output by the comparator to be tested with first voltage level and signals from the first and second strobe generating circuits, and based on these signals, performs window strobe decisions on the signals output by the comparator circuits; and
the second decision circuit receives the signal output by the comparator to be tested with second voltage level and signals from the first and second strobe generating circuits, and based on these signals, performs window strobe decisions on the signals output by the comparator circuits.

10. The IC test system according to claim 6 wherein
said comparator circuits compare a signal output from an integrated circuit to be tested with a first voltage level and a second voltage level,
said decision circuits include first and second decision circuits,
said first decision circuit receives the signal output by the comparator to be tested with first voltage level and signals from the first and the second strobe generating circuits, and based on these signals, performs window strobe decisions on the signals output by the comparator circuits; and
the second decision circuit receives the signal output by the comparator to be tested with second voltage level and signals from the first and second strobe generating circuits, and based on these signals, performs window strobe decisions on the signals output by the comparator circuits.

11. The IC test system according to claim 2 wherein
said control signal generating circuit outputs control signals for stopping the operation of said decision circuits to not start the window strobe decision, when the state stored in the memory changes to a window strobe decision end state; and
said decision circuit does not perform window strobe decisions when the decision circuit receives the control signals for stopping the operation output by the control signal generating circuit.

12. The IC test system according to claim 11 wherein
said comparator circuits compare a signal output from an integrated circuit to be tested with first voltage level and a second voltage level,
said strobe generating circuit includes a first strobe generating circuit and a second strobe generating circuit,
the first strobe generating circuit generates first strobe signals for window strobe start which have been timing corrected with respect to the first or second voltage levels and for window strobe end which have been timing corrected with respect to the first voltage level, based on the address signals and the test cycle signals; and
the second strobe generating circuit which generates second strobe signals for window strobe end which have been timing corrected with respect to the second voltage level based on the address signals and the test cycle signals.

13. The IC test system according to claim 12 wherein
said comparator circuits compare a signal output from an integrated circuit to be tested with a first voltage level and a second voltage level,
said decision circuits include first and second decision circuits, said first decision circuit receives the signal output by the comparator to be tested with first voltage level, the control signals from the control signal generating circuit, and signals from the first and second strobe generating circuits, and based on these signals, performs window strobe decisions on the signals output by the comparator circuits; and the second decision circuit receives the signal output by the comparator to be tested with second voltage level, the control signals from the control signal generating circuit, and signals from the first and second strobe generating circuits, and based on these signals, performs window strobe decisions on the signals output by the comparator circuits.

14. The IC test system according to claim 11 wherein said comparator circuits compare a signal output from an integrated circuit to be tested with a first voltage level and a second voltage level, said strobe generating circuit includes a first strobe generating circuit and a second strobe generating circuit, the first strobe generating circuit which generates first strobe signals for window strobe start which have been timing corrected with respect to the first or second voltage levels and for window strobe end which have been timing corrected with respect to the first voltage level, based on the address signals and the test cycle signals; and the second strobe generating circuit which generates second strobe signals for window strobe end which have been timing corrected with respect to the second voltage level based on the address signals and the test cycle signals.

15. The IC test system according to claim 14 wherein said comparator circuits compare a signal output from an integrated circuit to be tested with a first voltage level and a second voltage level, said decision circuits include first and second decision circuits, said first decision circuit receives the signal output by the comparator to be tested with first voltage level, the control signals from the control signal generating circuit, and signals from the first and second strobe generating circuits, and based on these signals, performs window strobe decisions on the signals output by the comparator circuits; and the second decision circuit receives the signal output by the comparator to be tested with second voltage level, the control signals from the control signal generating circuit, and signals from the first and second strobe generating circuits, and based on these signals, performs window strobe decisions on the signals output by the comparator circuits.

16. The IC teat system according to claim 11 wherein said comparator circuits compare a signal output from an integrated circuit to be tested with a first voltage level and a second voltage level, said decision circuits include first and second decision circuits, said first decision circuit receives the signal output by the comparator to be tested with frost voltage level, the control signals from the control signal generating circuit, and signals from the first and second strobe generating circuits, and based on these signals, performs window strobe decisions on the signals output by the comparator circuits; and the second decision circuit receives the signal output by the comparator to be tested with second voltage level, the control signals from the control signal generating circuit, and signals from the first and second strobe generating circuits, and based on these signals, performs window strobe decisions on the signals output by the comparator circuits.

17. An IC test system comprising:

a first comparator circuit which compares a signal output from an integrated circuit to be tested with a first voltage level, and outputs the results of the comparison;

a second comparator circuit which compares a signal output from an integrated circuit to be tested with a second voltage level which is different from the first voltage level, and outputs the results of the comparison;

a memory which stores at least one of a window strobe decision start state and a window strobe decision end state for each of the first and second voltage levels in each test cycle, based on address signals and test cycle signals which are input for performing window strobe decision;

a control signal generating circuit which receives the state stored in the memory and outputs control signals relating to the generation of window strobes based on the states stored in the memory, and wherein, when the state stored in the memory corresponds to window strobe decision start state, the control signal generating circuit holds the window strobe decision start state until the state stored in the memory changes to a window strobe decision end state, and outputs control signals for stopping the operation of first or second decision circuit in order not to start the window strobe decision; and a first strobe generating circuit which generates first strobe signals for window strobe start which have been timing corrected with respect to the first or second voltage levels and for window strobe end which have been timing corrected with respect to the first voltage level, based on the address signals and the test cycle signals;

a second strobe generating circuit which generates second strobe signals for window strobe end which have been timing corrected with respect to the second voltage level based on the address signals and the test cycle signals;

the first decision circuit which receives output, from the first comparator circuit, the control signals from the control signal generating circuit, and signals from the first and second strobe generating circuits, and based on these signals, performs window strobe decisions on the signals output by the first comparator circuit; and the second decision circuit which receives outputs from the first comparator circuit, the control signals from the control signal generating circuit, and signals from the first and second strobe generating circuits, and based on these signals, performs window strobe decisions on the signals output by the second comparator circuits.

* * * * *